US006428942B1

(12) United States Patent
Jiang et al.

(10) Patent No.: US 6,428,942 B1
(45) Date of Patent: Aug. 6, 2002

(54) MULTILAYER CIRCUIT STRUCTURE BUILD UP METHOD

(75) Inventors: Hunt Hang Jiang; Yasuhito Takahashi; Michael Guang-Tzong Lee; Wen-chou Vincent Wang; Mark McCormack, all of San Jose, CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/429,854

(22) Filed: Oct. 28, 1999

(51) Int. Cl.[7] ................................................ G03F 7/00
(52) U.S. Cl. ...................... 430/312; 430/314; 430/316; 430/330
(58) Field of Search ................................ 430/312, 314, 430/316, 330

(56) References Cited

U.S. PATENT DOCUMENTS

| | | | |
|---|---|---|---|
| 3,791,858 A | 2/1974 | McPherson et al. | 117/201 |
| 3,976,524 A | 8/1976 | Feng | 156/8 |
| 4,181,755 A | 1/1980 | Liu et al. | 430/314 |
| 4,614,021 A | 9/1986 | Hulseweh | 29/590 |
| 4,908,940 A | 3/1990 | Amano et al. | 29/852 |
| 4,915,983 A | 4/1990 | Lake et al. | 427/98 |
| 4,921,777 A | 5/1990 | Fraenkel et al. | 430/314 |
| 4,980,034 A | 12/1990 | Volfson et al. | 437/195 |
| 5,063,175 A | 11/1991 | Broadbent | 437/192 |
| 5,071,518 A | 12/1991 | Pan | 205/122 |
| 5,091,289 A | 2/1992 | Cronin et al. | 430/312 |
| 5,097,393 A | 3/1992 | Nelson et al. | 361/386 |
| 5,106,461 A | 4/1992 | Volfson et al. | 205/125 |
| 5,118,385 A | 6/1992 | Kumar | 156/644 |
| 5,137,597 A | 8/1992 | Curry, II et al. | 156/636 |
| 5,162,260 A | 11/1992 | Leibovitz | 427/195 |
| 5,283,081 A | 2/1994 | Kata et al. | 427/96 |
| 5,287,619 A | 2/1994 | Smith et al. | 29/852 |
| 5,316,974 A | 5/1994 | Crank | 437/190 |
| 5,337,466 A | 8/1994 | Ishida | 29/830 |
| 5,464,653 A | 11/1995 | Chantraine et al. | 427/96 |
| 5,512,514 A | 4/1996 | Lee | 437/195 |
| 5,654,237 A | 8/1997 | Suguro et al. | 438/624 |
| 5,699,613 A | 12/1997 | Chong et al. | 29/852 |
| 5,784,782 A | 7/1998 | Boyko et al. | 29/848 |
| 5,830,533 A | 11/1998 | Lin et al. | 427/272 |
| 5,834,845 A | 11/1998 | Stolmeijer | 257/752 |
| 5,843,839 A | 12/1998 | Ng | 438/637 |
| 5,891,606 A | * 4/1999 | Brown | 430/312 |
| 5,891,799 A | 4/1999 | Tsui | 438/624 |
| 5,916,453 A | 6/1999 | Beilin et al. | 216/38 |
| 6,013,417 A | * 1/2000 | Sebesta et al. | 430/312 |

FOREIGN PATENT DOCUMENTS

| | | | |
|---|---|---|---|
| JP | 56-116697 | 9/1981 | 3/46 |
| JP | 63-244796 | 10/1988 | 3/46 |

OTHER PUBLICATIONS

Pan et al., "A Planar Approach to High Density Copper–Polymide Interconnect Fabrication," pp. 174–189, Proceeding of the Technical Conference —8th Int'l Electronics Packaging Conference (1988).

Iwasaki et al., "A Pillar–Shaped Via Structure in a Cu–Polymide Multilayer Substrate," pp. 127–131, Proceedings of the 1989 Japan International Electronic Manufacturing Technology Symposium.

* cited by examiner

Primary Examiner—Janet Baxter
Assistant Examiner—Amanda C. Walke
(74) Attorney, Agent, or Firm—Coudert Brothers LLP

(57) ABSTRACT

Methods for forming multilayer circuit structures are disclosed. In some embodiments, conductive layers, dielectric layers and conductive posts can be formed on both sides of a circuitized core structure. The conductive posts are disposed in the dielectric layers and can be stacked to form a generally vertical conduction pathway which passes at least partially through a multilayer circuit structure. The formed multilayer circuit structures can occupy less space than corresponding multilayer circuit structures with stacked via structures.

63 Claims, 6 Drawing Sheets

MULTILAYER CIRCUIT STRUCTURE BUILD UP METHOD

TECHNICAL FIELD OF THE INVENTION

Embodiments of the invention relate to methods for forming multilayer circuit structures.

BACKGROUND OF THE INVENTION

Multilayer circuit structures can be used to electrically communicate two or more electrical devices such as two or more computer chips. Multilayer circuit structures typically contain multiple conductive layers separated by one or more dielectric layers. Via structures disposed in apertures in the dielectric layers provide conductive paths so that electrical signals can pass from one conductive layer to another conductive layer. Multiple via structures in successive dielectric layers can be used to form a conductive path from an inner region to an outer region of a multilayer circuit structure.

The via structures in successive dielectric layers can be staggered in a multilayer circuit structure. For example, as shown in FIG. 1, a plurality of staggered via structures 11 are in electrical communication with each other. The staggered conductive path formed by the via structures 11 can provide communication between a core structure 12 and an outer surface of the multilayer circuit structure 10. Each of the via structures 11 shown in FIG. 1 is in the form of a conductive coating on an aperture wall in a dielectric layer. Unfortunately, staggering the via structures can consume valuable area in a multilayer circuit structure and can increase the signal run length. This can decrease the density of the circuitry in a multilayer circuit structure. Moreover, the metal coating of via structures of the type shown in FIG. 1 is thin. Open circuits can form if the coating is not thick enough or is not uniform.

It would be desirable to provide a method for efficiently producing a reliable high-density multilayer circuit structure in a cost effective manner.

SUMMARY OF THE INVENTION

Embodiments of the invention are directed to methods for forming multilayer circuit structures, particularly high density multilayer circuit structures, having stacked via structures. The via structures are preferably stacked conductive posts.

One embodiment of the invention can be directed to a method for forming a multilayer circuit structure. The method comprises: forming a first plurality of conductive posts on first and second sides of a circuitized core structure, each conductive post having an end proximate to the core structure and an end distal to the core structure; depositing a first dielectric layer on the first side of the core structure; depositing a second dielectric layer on the second side of the core structure; removing dielectric layer material from the distal ends of the first plurality of conductive posts; and forming a second plurality of conductive posts on the distal ends of the first plurality of conductive posts.

Another embodiment is directed a method comprising: forming a first plurality of conductive posts on a side of a circuitized core structure, each conductive post having an end proximate to the core structure and an end distal to the core structure; laminating a dielectric layer on the core structure; depositing a protective layer on the dielectric layer; removing dielectric layer material from the distal ends of the first plurality of conductive posts through the protective layer; and forming a second plurality of conductive posts on the distal ends of the first plurality of conductive posts.

These and other embodiments of the invention can be described with reference to the Figures and the Detailed Description.

BRIEF DESCRIPTION OF THE DRAWINGS

Embodiments of the invention can be described more clearly with reference to the Figures. The following Figures are used for illustration purposes and are not intended to limit the invention.

Figure 1:
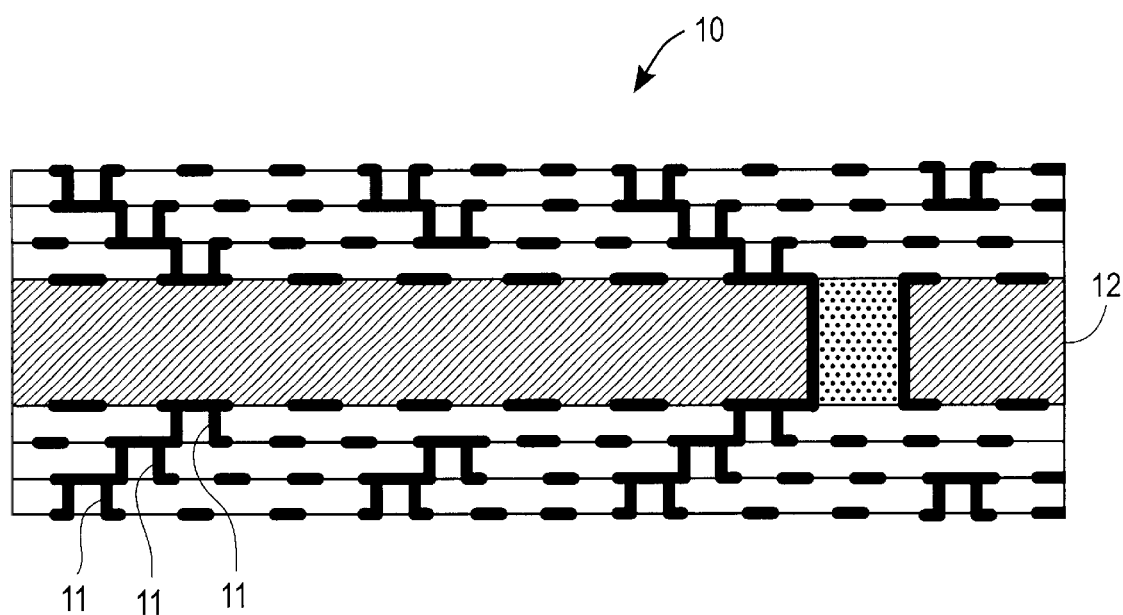
FIG. 1 shows a cross section of a multilayer circuit structure with staggered via structures.

These and other embodiments can be more clearly described in the following Detailed

DETAILED DESCRIPTION

Embodiments of the invention are directed to methods for forming multilayer circuit structures. In preferred embodiments, the methods comprise forming a first plurality of conductive posts on first and second sides of a circuitized core structure. Each conductive post has an end proximate to the core structure and an end distal to the core structure. After the conductive posts are formed, a first dielectric layer is deposited on the first side of the core structure and a second dielectric layer is deposited on the second side of the core structure. Dielectric layer material deposited on the distal ends of the first plurality of conductive posts is then removed. After removing the dielectric layer material from the ends of the posts, circuit patterns are formed on the dielectric layers. The formed circuit patterns can include conductive pads disposed over the cleaned distal ends of the posts. A second plurality of conductive posts can then be formed on the conductive pads on the distal ends. The second plurality of conductive posts can be stacked on the first plurality of conductive posts. Additional sets of subsequently formed conductive posts (e.g., third, fourth pluralities) and pads can be stacked on the second plurality of conductive posts to form a plurality of generally vertical conductive pathways (e.g., generally perpendicular to the orientation of the core structure) through the dielectric layers. The generally vertical conductive pathways can result in a multilayer circuit structure which occupies less space than a similar multilayer circuit structure having staggered via structures.

In embodiments of the invention, multilayer circuit structures can be formed quickly and efficiently. For example, in preferred embodiments, the dielectric layers, conductive posts, and conductive patterns including conductive pads can be simultaneously formed or deposited on opposite sides of multilayer circuit structure precursors (e.g., a core structure). For example, in embodiments of the invention, conductive posts can be simultaneously electroplated on conductive regions on opposite sides of a core structure. Furthermore, in preferred embodiments, the multilayer circuit structures having stacked conductive posts can be formed using less expensive processes such as photolithography and electroplating. More expensive techniques such as laser drilling are not needed in preferred embodiments of the invention. Consequently, high density multilayer circuit structures having high circuit densities can be formed efficiently and cost-effectively.

The conductive posts and conductive patterns in the multilayer circuit structures are preferably formed by additive processes. Additive processes have advantages over subtractive processes. For example, subtractive processes use etchants to remove metal from continuous metal layers to form conductive patterns. The uniformity of the lines in the etched patterns can be difficult to control, because etchants can undercut the lines. Consequently, it can be difficult to form fine line patterns using subtractive processes. In an additive process, however, the conductive pattern resolution is limited only by the resolution of the photoresist used to form the conductive patterns. Consequently, fine line and high density circuit patterns can be produced using additive processes. For instance, the circuit lines can have widths of 25 microns or less, and can be at a pitch of about 50 microns or less. In addition, in subtractive processes, metal layers are etched and then rinsed. The etching and rinsing processes consume large amounts of wet chemicals and water and can generate large amounts of waste (e.g., wasted metal). However, because of the reduced number of etching steps used in a typical additive process, the waste generated from a typical additive process is less than a typical subtractive process.

Figure 2:
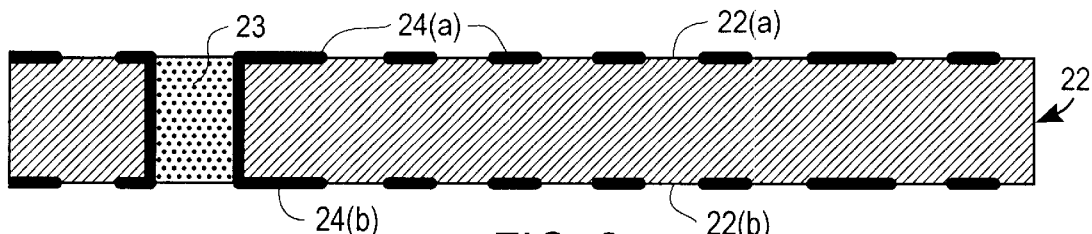
FIGS. 2 to 15 show cross sections of multilayer circuit structure precursors used to form a multilayer circuit structure with stacked conductive posts.

Embodiments of the invention can be described with reference to the Figures. FIG. 2 shows a circuitized core structure 22 upon which a plurality of conductive posts are formed. The core structure 22 includes a first side 22(a) and a second side 22(b), and can be flexible or rigid. The first and second sides 22(a), 22(b) can have, respectively, a first plurality of conductive regions 24(a) and a second plurality of conductive regions 24(b). The first and second conductive regions 24(a), 24(b) can include, e.g., lines, pads, or the ends of via structures. Moreover, the first and second conductive regions 24(a), 24(b) can be made of any suitable conductive material including copper, and can have any suitable thickness including a thickness of less than about 50 microns, and preferably between about 18 to about 36 microns. In addition to having conductive regions 24(a), 24(b) on the outer surfaces of the core structure 22, the core structure 22 may also include two or more dielectric layers and one or more conductive layers (not shown) embedded within the core structure 22.

The core structure 22 can also include one or more via structures 23. The via structures can communicate the conductive regions 24(a), 24(b) on the first and second sides 22(a), 22(b) of the core structure 22. The via structures can be solid conductive posts, or can be plated through holes (PTH) which have been filled with a conductive or a non-conductive material. For example, the PTH can be filled with a polymeric material such as an epoxy-based polymer, with or without an embedded conductive material. In another example, the PTH can be filled with a conductive paste such as a silver filled conductive paste. Filling the PTH with a material displaces any air which might otherwise reside in the PTH. It is preferable to remove any air pockets which might reside in the resulting multilayer circuit structure, because trapped air may cause reliability problems in some instances.

In a typical PTH filling process, an aperture can be formed in a rigid insulating board. Metal can be electroplated onto the wall of the aperture to form a PTH. After forming the PTH, a conductive or non-conductive filler material can be deposited within the PTH by, e.g., stenciling. If the filler material is curable, the filler material can be cured within the PTH. Before or after curing, any excess filler material on the first and second sides of the core structure can be removed.

In preferred embodiments, after the core structure is formed, a first plurality of conductive posts are formed on both the first and second sides of the circuitized core structure. Each conductive post can have an end proximate to the core structure and an end distal to the core structure. The conductive posts are preferably solid and/or substantially homogeneous in composition (e.g., all metal). The posts may also include any suitable conductive material. Suitable conductive materials include metal or metal alloys including copper, silver, gold, nickel, palladium, and aluminum. The conductive material is preferably copper.

The conductive posts may include any suitable dimensions. For example, the conductive posts can have a height of at least about 10 microns, preferably between about 15 to about 75 microns, and more preferably between about 25 to about 50 microns. The conductive posts can have any suitable diameter including a diameter between about 10 to about 150 microns, preferably between about 25 to about 75 microns. In addition, each of the posts may have a generally round radial cross-section.

The conductive posts (e.g., the first plurality of conductive posts) can be formed using any suitable process. For example, plating processes such as electroless or electroplating processes can be used to form the conductive posts.

Figure 3:
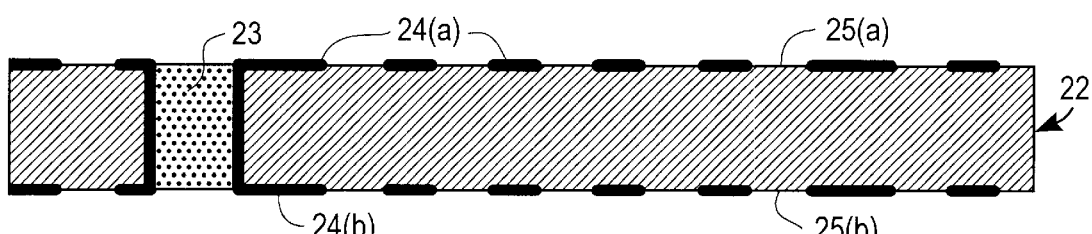

The conductive posts are preferably formed by electroplating. With reference to FIG. 3, seed layers 25(a), 25(b) can be deposited on the first and second sides 22(a), 22(b) of the core structure 22. The seed layers 25(a), 25(b) can be used to help initiate the plating of the subsequently formed conductive posts. Preferably, the seed layers 25(a), 25(b) are deposited simultaneously, but they can be deposited sequentially in some instances. Any suitable process including sputtering and electroless plating can be used to deposit the seed layers. Electroless plating is preferred as it is generally less expensive than sputtering. Regardless of how they are deposited, the seed layers 25(a), 25(b) may have a thickness of about 3 microns or less. Preferably, the thickness of each seed layer is between about 0.1 to about 1.0 micron, and is more preferably between about 0.3 to about 0.6 micron.

Prior to depositing the seed layers, the first and second sides of the core structure may be conditioned. For example, to increase the adhesion of seed layers to the sides of the core structure, the surfaces of the core structure can be roughened. Roughening can be performed using any suitable process including an etch process such as a permanganate etch process. By roughening the surfaces of the core structure prior to depositing the seed layers, the seed layers are more likely to adhere to the surfaces of the core structure.

After depositing the seed layers, photoresist layers can be deposited on the seed layers. The photoresist layers can be in the form of a film or a liquid prior to being deposited on the first and second sides of the core structure. An example of a suitable dry film photoresist is Riston™ 9000, commercially available from E.I. du Pont de Nemours, Inc. An example of a suitable liquid photoresist is AZ4620 liquid photoresist commercially available from Clariant, Inc. The photoresist layers may be positive or negative, and can be deposited on the first and second sides of the core structure simultaneously or sequentially.

The photoresist layers may be deposited by any suitable process including roller coating, spin coating, curtain coating, screen printing, slot coating, spray coating, and doctor blade coating. These processes are suitable for depositing liquid photoresist layers. Preformed photoresist layers may be deposited by laminating. Preferably, the photoresist layers are deposited by laminating. For example, in some embodiments, a double-sided hot roll laminator may be used to laminate preformed layers of photoresist on both sides of the core structure simultaneously.

After depositing the photoresist layers, photoresist patterns can be formed using conventional photolithographic techniques. For example, the deposited photoresist layers can be irradiated with a pattern of radiation. The irradiated photoresist layers can then be developed to form patterned photoresist layers. For example, with reference to FIG. 4, after the photoresist layers on both sides of the core structure 22 are developed, the developed photoresist layers 31(a), 31(b) can have a plurality of apertures 32(a), 32(b) disposed over one or more conductive regions 24(a), 24(b) on opposite sides of the core structure 22. The patterned photoresist layers can be used as masks to selectively deposit conductive material in predetermined areas. Deposition processes such as electroplating or electroless plating can be used to deposit the conductive material on regions not covered by the patterned photoresist layers.

Figure 4:
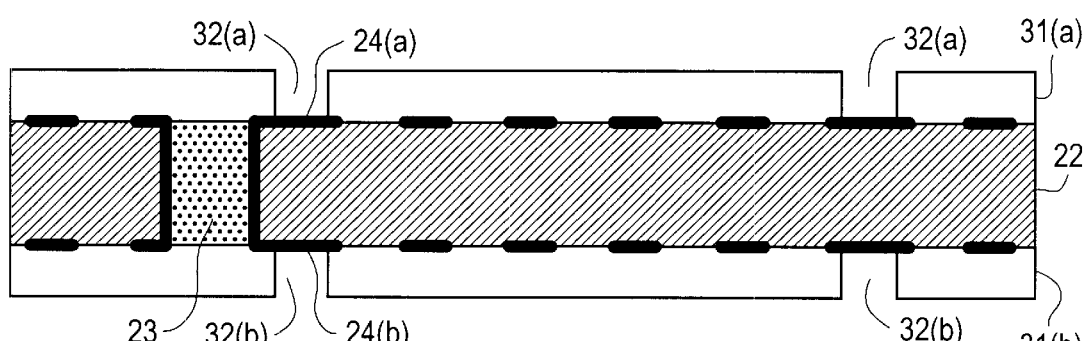
Figure 5:
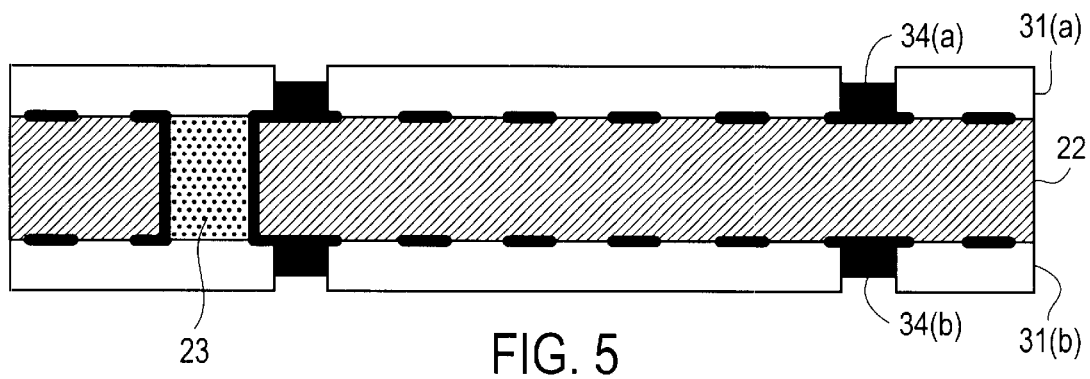

With reference to FIGS. 4 and 5, a first plurality of conductive posts 34(a), 34(b) are formed within the apertures 32(a), 32(b) of the photoresist layers 31(a), 31(b), and on the conductive regions 24(a), 24(b) exposed through the photoresist layers 31(a), 31(b). In this example, the first plurality of conductive posts includes conductive posts 34(a) on the first side of the core structure 22 and conductive posts 34(b) on the second side of the core structure 22. The first plurality of conductive posts 34(a), 34(b) are preferably formed on both sides of the core structure simultaneously. For example, the structure shown in FIG. 4 can be placed in an electroplating bath. In the electroplating bath, conductive material can plate from the conductive regions 24(a), 24(b) to the open ends of the apertures 32(a), 32(b) to form a first plurality of conductive posts 34(a), 34(b).

Although the use of seed layers are described in detail with respect to the illustrated embodiments, seed layers need not be used in other embodiments. For example, the conductive regions 24(a), 24(b) exposed through the photoresist layers 31(a), 31(b) may be suitable to initiate the direct plating of posts within the apertures 32(a), 32(b) of the photoresist layers 31(a), 31(b), without the need to deposit seed layers.

Figure 6:
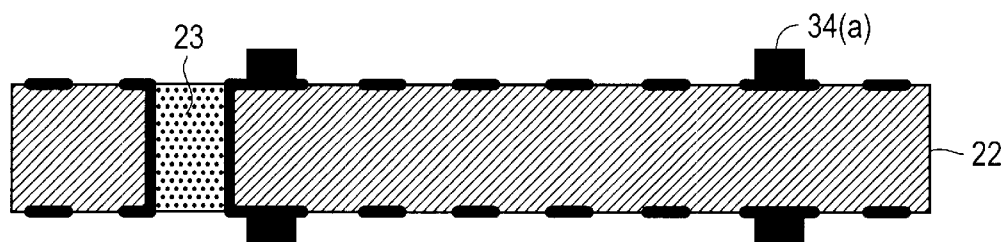

After the first plurality of conductive posts 34(a), 34(b) are formed, the photoresist layers 31(a), 31(b) which were used to form the conductive posts 34(a), 34(b) can be removed (e.g., stripped) from the core structure 22. As shown in FIG. 6, after the photoresist layers 31(a), 31(b) are removed, the first plurality of conductive posts 34(a), 34(b) are disposed on the core structure 22 and protrude from the surfaces of the core structure 22.

After the photoresist layers 31(a), 31(b) are removed, the seed layers 25(a), 25(b), if present, can also be removed. Preferably, the seed layers are etched in a flash etching process. In a typical flash etching process, the seed layers can be etched for a short period of time. After flash etching, the seed layers are completely removed from the dielectric layer surfaces, and an insubstantial portion of the formed conductive posts 34(a), 34(b) may also be removed.

After the first plurality of conductive posts are formed on the core structure, dielectric layers may be deposited on the first and second sides of the core structure. The dielectric layers may include any suitable material including any suitable polymeric material. Exemplary dielectric layer materials include polyimide, epoxy-functional materials, and BT resins. Moreover, the dielectric layers may optionally include a filler. Preferable fillers can include particles such as silica or alumina particles, but may include chopped, woven, or nonwoven fibers. Preferably, the dielectric layers are in the form of a preformed layer. Examples of preformed dielectric layers include ABF-SH9 film commercially available from Ajinomoto, Inc., and BT346 film commercially available from Mitsubishi Gas and Chemical, Inc. In addition, the dielectric layers are preferably non-photoimageable. Non-photoimageable dielectric materials typically have a higher glass transition temperature ($T_g$ and a lower moisture absorption rate than photoimageable dielectric layers. Consequently, multilayer circuit structures having non-photoimageable dielectric layers are generally more reliable than photoimageable dielectric layers.

The deposited dielectric layers may have any suitable thickness including a thickness of about 75 microns or less, preferably between about 25 to about 50 microns. The individual dielectric layers on the core structure may have the same or different thickness. Preferably, an individual dielectric layer can have a thickness which is less than or equal to the combined height of a post and pad upon which the post is disposed. For example, the thickness of a dielectric layer may be about 2 to about 8% less (e.g., 5% or less) than the combined height of a conductive post and a conductive pad upon which the conductive post is disposed.

The dielectric layers may be sequentially or simultaneously deposited onto opposite sides of the core structure. For example, a first dielectric layer can be deposited on a first side of a core structure by depositing a liquid dielectric material on the first side. The deposited liquid can then be softbaked to solidify the deposited layer, and can then be optionally cured. After the first dielectric layer is deposited, a second dielectric layer can be deposited on the second side of the core structure in the same or different manner as the first dielectric layer.

The dielectric layers may be deposited using any suitable process including spin coating, screen printing, slot coating, doctor blade coating, curtain coating, etc. These processes can be used to deposit liquid dielectric layers. Laminating can be used to deposit preformed dielectric layers. The dielectric layers may even be deposited by a gas-phase deposition process such as a chemical vapor deposition (CVD).

Preferably, the first and second dielectric layers are respectively laminated to the first and second sides of the core structure. In these embodiments, the dielectric layers may be preformed prior to being deposited on the core structure. By depositing a preformed dielectric layer onto the core structure, the thickness of the dielectric layer is substantially uniform when present on the core structure. In addition, by laminating preformed dielectric layers onto a core structure, dielectric layers on opposite sides of the core structure can be deposited simultaneously, thus providing for more efficient processing.

Figure 7:
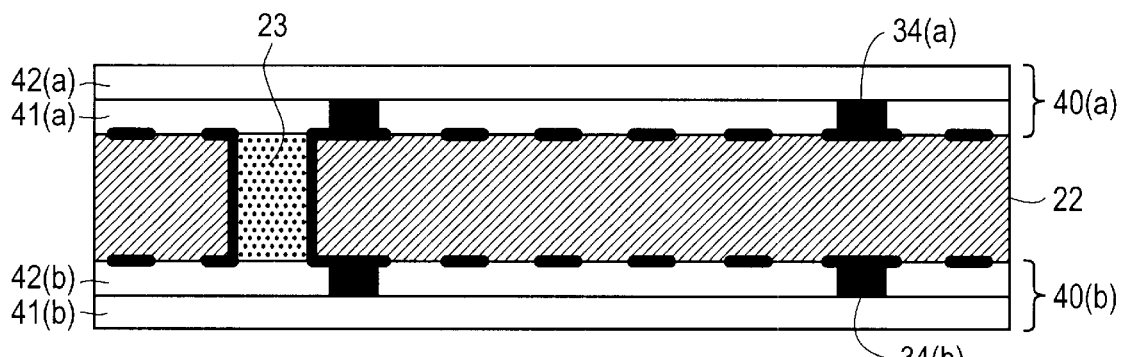

Preferably, a preformed dielectric layer is disposed on a carrier layer prior to being laminated to the core structure. The carrier layer may include any suitable polymeric material including polyethylene terephthalate. The preformed dielectric layer and the carrier layer may form a composite. Suitable composites are commercially available from Ajinomoto, Inc. (e.g., ABF-SH9). With reference to FIG. 7, composites 40(a), 40(b) including a carrier layer 42(a), 42(b) and a dielectric layer 41(a), 41(b) are laminated to the first and second sides of the core structure 22. The composites 40(a), 40(b) are laminated to the core structure 22 so that the carrier layers 42(a), 42(b) are disposed on the outer surfaces of the dielectric layers 41(a), 41(b). The composites 40(a), 40(b) are preferably flexible and can be laminated to the core structure 22 simultaneously or sequentially.

The composites can be laminated to the core structure using any suitable apparatus. Heat and pressure can be applied to the dielectric layers to soften them so that they can conform to the surfaces to which they are laminated. The heating temperature and/or pressure can chosen in accordance with the particular material used for the dielectric layer. For example, a hot roll laminator can be used to laminate composites of this type onto opposing sides of the core structure simultaneously or sequentially. In some embodiments, the rolls of the hot roll laminator can be between about 60° C. to about 120° C. (preferably 80° C. to about 90° C.), and the rollers can run at a speed of about 1 to about 2 meters per minute. A vacuum laminator can also be used to laminate the dielectric layers or composites to the core structure. For example, using heat, the vacuum laminator can operate near vacuum (e.g., less than 1 atm) for a few minutes (e.g., 5 minutes or more). Alternatively, composites can be laid on opposite sides of a core structure, placed in a lamination press (e.g., a hydraulic press), and then laminated together. The lamination press can operate at a temperature of about 80° C. to about 90° C., and at a pressure of about 1 to about 3 kg/cm$^2$ for a few minutes, (e.g., about 5 minutes or more). Regardless of the specific lamination apparatus used, after lamination, the dielectric layers may be disposed on opposite sides of the core structure and can be sandwiched between carrier layers.

After depositing the dielectric layers 41(a), 41(b), the dielectric layers 41(a) may be optionally cured. The dielectric layers can be cured in any suitable manner. For example, an electron-beam, heat, and/or U-V radiation can be used to cure the dielectric layers. The dielectric layers are cured in a lamination press, or preferably an oven, using heat.

Release layers may be optionally disposed on the uncured dielectric layers prior to and/or during curing (e.g., in a lamination press). The release layers preferably include a heat resistant material. Exemplary release layer materials include Teddler™ paper (commercially available from du Pont), fluoropolymeric materials such as polytetrafluoroethylene (Teflon™), or metal (e.g., aluminum, copper). If the release layer is a copper foil, a shiny side of the foil is preferably in contact with the dielectric layer. In these embodiments, the previously described carrier layer (if used) may be optionally replaced with a release layer which has a higher melting temperature than the carrier layer. For example, the carrier layer can have a melting temperature less than 150° C. while the release layer can have a melting temperature greater than about 150° C.

Figure 8:
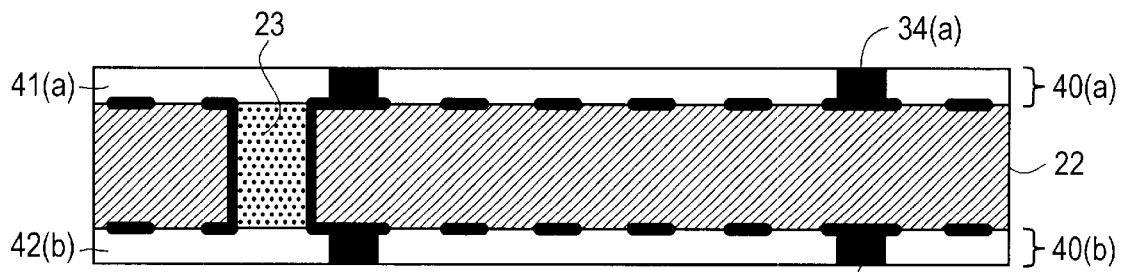
Figure 9:
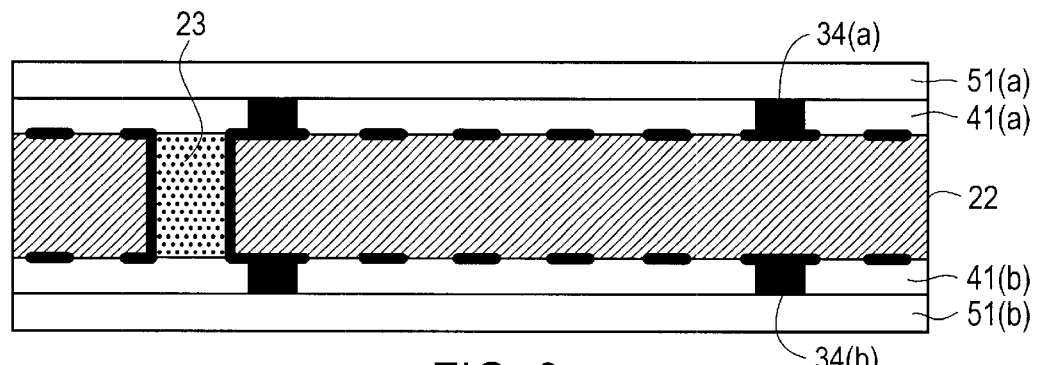

With reference to FIGS. 7 to 9, carrier layers 42(a), 42(b) can be separated (e.g., peeled) from the first and second dielectric layers 41(a), 41(b) after they are laminated to the core structure 22. Then, release layers 51(a), 51(b) can be deposited on the uncured first and second dielectric layers 41(a), 41(b). Preferably, the release layers 51(a), 51(b) are laminated to the first and second dielectric layers 41(a), 41(b). Heat, and optionally pressure, are applied to the structure to cure the dielectric layers 41(a), 41(b). For example, the first and second dielectric layers 41(a), 41(b) can be heated to a temperature of about 170° C. or more and can be subjected to a pressure of about 3.5 to about 20 kg/cm$^2$ for about 60 minutes or more. The heat and pressure may be applied with a lamination press. After curing, the release layers 51(a), 51(b) can then be separated (e.g., by peeling) from the cured dielectric layers 41(a), 41(b).

In preferred embodiments, (with reference to FIGS. 7 and 8) an uncured dielectric layer on the core structure may be cured without the use of a release layer. For example, after laminating a carrier layer/dielectric layer composite to a core structure, the carrier layer can be removed from the dielectric layer. Then, the dielectric layer on the core structure can be cured.

In other embodiments, the dielectric layers can be partially cured and then conditioned (e.g., roughened) prior to complete curing. For instance, a precursor structure including a core structure and dielectric layers may be placed in an oven and baked for about 150° C. or more for about 30 minutes or less to partially cure the dielectric layers. Then, the outer surfaces of the dielectric layers may be roughened. For example, an etch process such as a permanganate etch process can be used to roughen the surfaces of a dielectric layer. After roughening, circuit patterns can be formed on the dielectric layer. The circuit patterns can include conductive pads disposed on the distal ends of the first plurality of conductive posts. The dielectric layers may then be baked again to fully cure them. For example, to fully cure the dielectric layers, the dielectric layers can be additionally heated at about 170° C. or more for about 60 to about 90 minutes, or more. Then, a second plurality of conductive posts can be formed on the conductive pads. Advantageously, by roughening the outer surfaces of the dielectric layers, any subsequently deposited seed layers or conductive layers can tightly adhere to the surfaces of the dielectric layers.

After the dielectric layers 41(a), 41(b) are deposited on the core structure 22, dielectric layer material present on the distal ends of the first plurality of conductive posts 34(a), 34(b) can be removed to clean the post ends. In some embodiments, residual dielectric layer material can be present on the distal ends of the conductive posts after one or more dielectric layers are deposited on the core structure. For example, after laminating and curing, a dielectric layer on the conductive posts on the core structure, residual dielectric layer material can remain on the post ends. The residual dielectric material is typically 10 microns or less, and is often is about 2 to about 5 microns thick. After the post ends are cleaned, additional conductive posts can be subsequently formed on the first plurality of conductive pads and posts 34(a), 34(b). The formed conductive posts can be stacked and are electrically coupled together to form a generally vertical electrical pathway through one or more dielectric layers.

Any suitable process can be used to remove dielectric material from the distal ends of the conductive posts. Exemplary removal processes include etching processes such as a permanganate etch process, plasma etch process, or an abrading process such as mechanical polishing. In preferred embodiments, mechanical polishing can be used to remove the dielectric layer material. Mechanical polishing can be performed by using a polishing apparatus such as an oscillation deburrer. Oscillation deburrers are commercially available from Ishii Hyoki. The polishing apparatus can include buffing elements such as SiC and Al$_2$O$_3$ buffing wheels. In a typical operation, the revolution speed of the wheels can be about 2000 revolutions per minute (rpm) or more, and the oscillation cycle of the wheels is about 470 (cycles per minute) or more, and the oscillation stroke of the wheels is about 5 mm or more. The wheel pressure can be controlled automatically by preset pressure at a range of 0.25 to about 20 kg/cm$^2$. In other embodiments, the dielectric material on the distal ends of the conductive posts may be ablated. For example, a laser can be used to ablate the dielectric layer material from the ends of the conductive posts.

Figure 10:
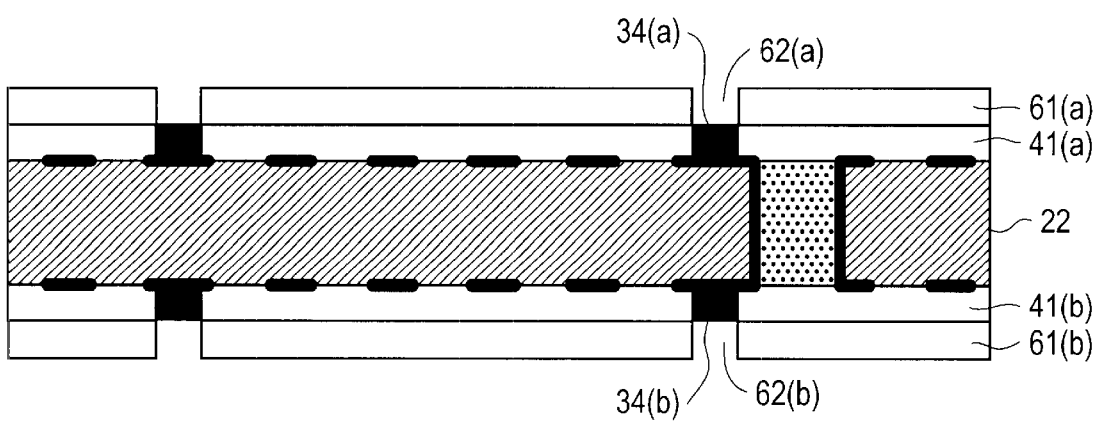

Optionally, protective layers may be used during the dielectric material removal process to protect the dielectric layer regions not disposed on the conductive posts. With reference to FIG. 10, protective layers 61(*a*), 61(*b*) can be disposed on the dielectric layers 41(*a*), 41(*b*). The apertures 62(*a*), 62(*b*) of the protective layers 61(*a*), 61(*b*) can be disposed over the distal ends of the conductive posts 34(*a*), 34(*b*). Dielectric layer material on the distal ends of the conductive posts are exposed through the protective layer apertures. By using a protective layer during the dielectric material removal process, the deposited dielectric layers are protected in the regions not disposed on the ends of the posts. Consequently, in these embodiments, unwanted dielectric layer material can be selectively removed. For example, a wide area laser can scan the outer surface of a protective layer disposed on a dielectric layer. The laser can ablate dielectric layer material exposed through apertures in the protective layer. Regardless of the particular removal process used, after removing the dielectric material from the ends of the conductive posts, the protective layers can be removed from the dielectric layers. For instance, the protective layers may be removed by etching or peeling.

The protective layers may deposited onto or formed on the previously deposited dielectric layers in any suitable manner. For example, in one embodiment, a layer of photoresist can be deposited, irradiated, and developed on a deposited dielectric layer to form a protective layer. In another embodiment, a protective layer with apertures is preformed, and is then laminated to a dielectric layer so that the distal ends of the posts (and any dielectric layer material thereon) are accessible through the apertures. The apertured protective layer may be the same as, derived from, or different from the previously described release or carrier layers.

In another example, apertures in the protective layers 61(*a*), 61 (*b*) can be formed when the dielectric layer material is removed from the distal ends of the conductive posts. For example, a continuous protective layer can be laminated to a dielectric layer on a core structure. The dielectric layer material on the distal ends of the conductive posts may be ablated along with portions of the protective layer disposed on the distal ends. In this case, additional cleaning of the distal ends of the posts may not be needed after ablation and the formed apertured protective layer can simply be removed from the dielectric layers. Any residual material from the ablation process can remain on the outer surface of the formed protective layers and can be removed along with the protective layers. For example, any ash generated by the ablation process can be removed along with the protective layers when the protective layers are peeled off of the dielectric layers.

Figure 11:
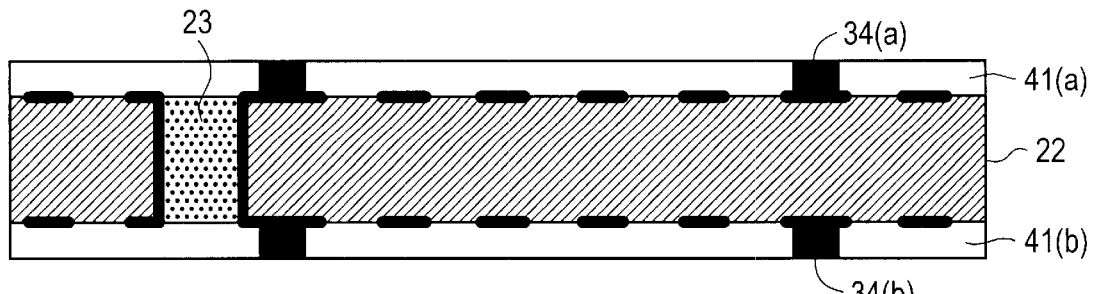
Figure 12:
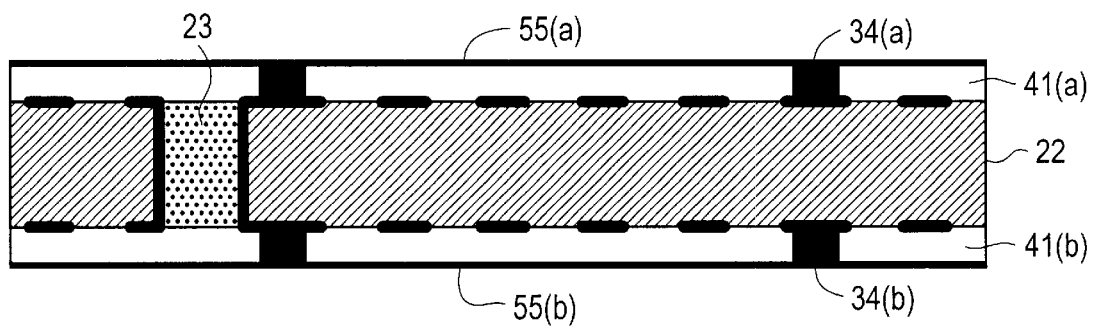
Figure 13:
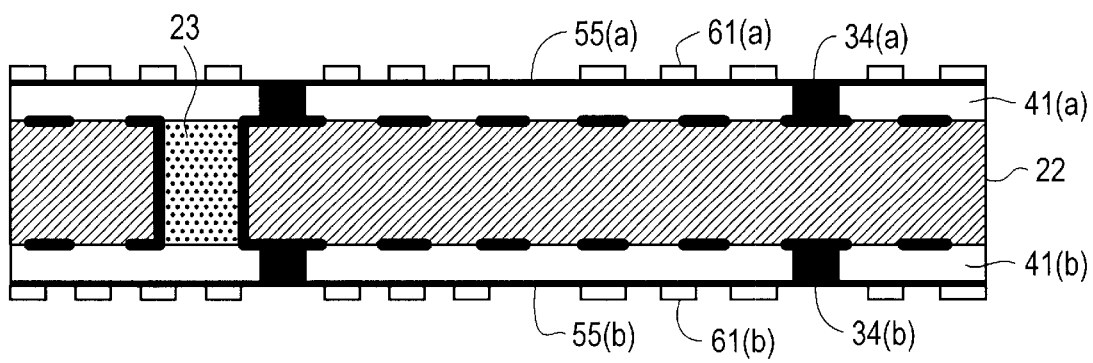

After the dielectric layers are deposited, conductive patterns can be formed on the dielectric layers. This can be done before the second plurality of conductive posts are formed. The conductive patterns are preferably formed by an additive process such as electroplating. For example, with reference to FIGS. 11 and 12, after any carrier layers, release layers, or protective layers are removed (if used), seed layers 55(*a*), 55(*b*) may be deposited on the outer surfaces of the first and second dielectric layers 31(*a*), 31(*b*) and over the distal ends of the first plurality of conductive posts 34(*a*), 34(*b*). Prior to depositing the seed layers, the dielectric layer surfaces can be conditioned (e.g., roughened) in the same or different manner as described above for the core structure 22. Then, photoresist layers may be deposited over the seed layers 55(*a*), 55(*b*), irradiated, and then developed to form patterned photoresist layers 61(*a*), 61(*b*). The photoresist layers 61(*a*), 61(*b*) may have the same or different characteristics as the previously described photoresist layers 31(*a*), 31(*b*). As shown in FIG. 13, the patterned photoresist layers 61(*a*), 61(*b*) can be disposed on the seed layers 55(*a*), 55(*b*).

Figure 14:
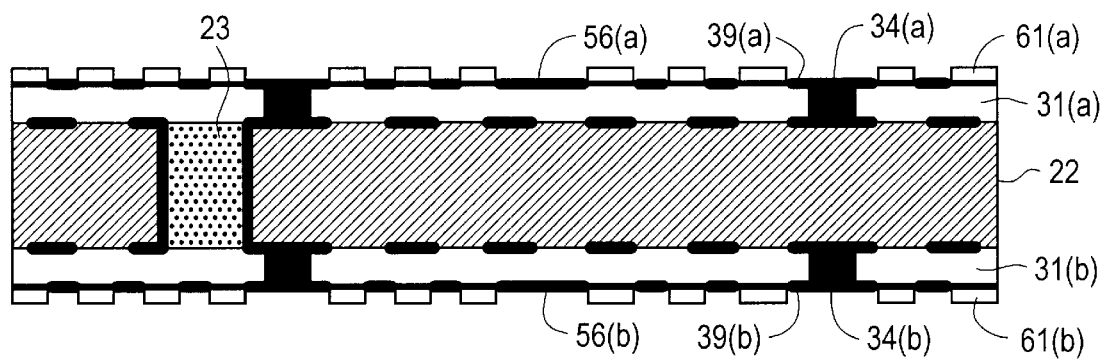

With reference to FIG. 14, conductive patterns 56(*a*), 56(*b*) are then formed (e.g., by electroplating) on the portions of the seed layers not covered by the developed photoresist layers 61(*a*), 61(*b*). The conductive patterns are preferably made of the same material as the conductive posts. The thickness of the formed conductive patterns 56(*a*), 56(*b*) can be between about 5 to about 35 microns, preferably between about 10 and about 20 microns. After the conductive patterns 56(*a*), 56(*b*) are formed, the photoresist layers 61(*a*), 61(*b*) can be removed (e.g., by stripping) from the surfaces of the dielectric layers 31(*a*), 31(*b*).

The conductive patterns may include a number of pads 39(*a*), 39(*b*) which are disposed on the distal ends of the first plurality of conductive posts. The pads generally have a larger surface area than the diameter of the conductive posts upon which they are disposed. Typically, a pad is disposed between respectively stacked conductive posts and is in direct contact with the stacked conductive posts.

Figure 15:
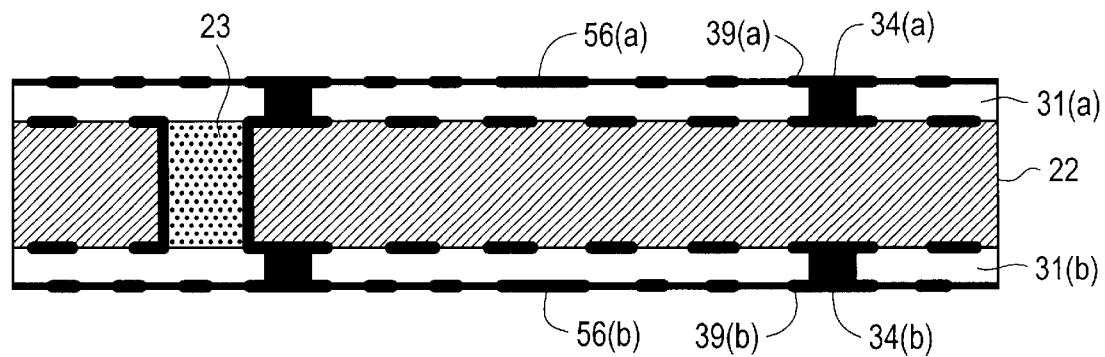

Then, a second plurality and any subsequent plurality of conductive posts, dielectric layers, and conductive patterns can be formed on the structure shown in FIG. 15, or any subsequent multilayer circuit structure precursor, by repeating one or more of the previously described steps. For example, the process used to form the second plurality of conductive posts can be the same or different process used to form the first plurality of conductive posts. Preferably, the first, second, and any subsequent plurality of posts are formed by electroplating. Once the conductive patterns 56(*a*), 56(*b*) and conductive posts are formed, any seed layers 55(*a*), 55(*b*) can be etched (e.g., by flash etching).

Figure 16:
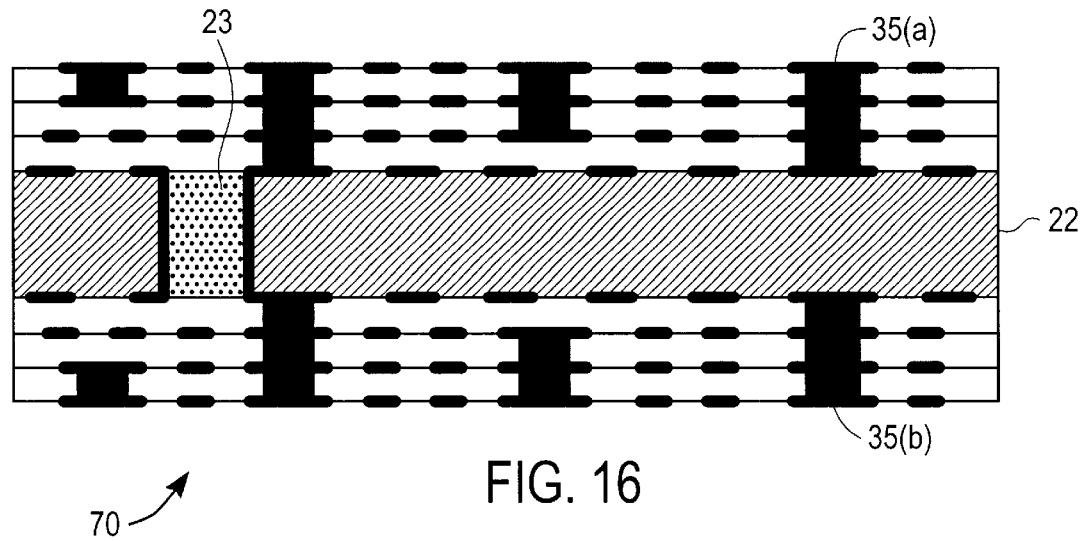
FIG. 16 shows a cross section of a multilayer circuit structure with stacked conductive posts.

Any number of conductive patterns, conductive posts, and dielectric layers can be included in the formed multilayer circuit structure. For example, the multilayer circuit structure 70 shown in FIG. 16 includes a circuitized core structure 22, and three dielectric layers and three conductive layers on each side of the core structure 22. The multilayer circuit structure 70 also includes generally vertical conductive pathways, each pathway including stacked conductive posts, with a pad between each adjacent pair of stacked posts. The generally vertical conductive pathways permit the size of the formed multilayer circuit structure to be reduced in comparison with a similar multilayer circuit structure with staggered via structures. Consequently, embodiments of the invention can be used to produce reliable, high density multilayer circuit structures efficiently and in a cost efficient manner.

After the multilayer circuit structure is formed, surface finishes or solder masks can be applied to the outer surfaces of the multilayer circuit structure. For example, a Ni/Au pad finish and/or a solder mask can be formed on the outer surfaces of a formed multilayer circuit structure. Accordingly, the multilayer circuit structures can be used in, for example, single chip modules, multichip modules and/or as mother or daughter boards in an electrical assembly.

While embodiments of the invention have been particularly described with respect to particularly illustrated embodiments, it will be appreciated that various alterations, modifications and adaptations may be made based on the present disclosure, and are intended to be within the spirit and scope of the present invention. Moreover, one or more features of any embodiment or example of the invention can be combined with any one or more features of any other embodiment or any other example of the invention without departing from the scope of the invention.

What is claimed is:

1. A method comprising:
   forming a first plurality of conductive posts on first and second sides of a circuitized core structure, each conductive post having an end proximate to the core structure and an end distal to the core structure;
   depositing a first dielectric layer on the first side of the core structure, said depositing a first dielectric layer comprising laminating a composite to the first side of the core structure, wherein the composite comprises a carrier layer and the first dielectric layer;
   depositing a second dielectric layer on the second side of the core structure;
   removing dielectric layer material from the distal ends of the first plurality of conductive posts;
   forming a second plurality of conductive posts on the distal ends of the first plurality of conductive posts; and
   removing the carrier layer.

2. The method of claim 1 further comprising:
   curing the first dielectric layer.

3. The method of claim 1 further comprising:
   laminating a release layer on the first dielectric layer; and
   curing the first dielectric layer.

4. The method of claim 1 wherein removing dielectric layer material comprises:
   etching, ablating, or abrading the dielectric layer material on the distal ends of the first plurality of conductive posts.

5. The method of claim 1 wherein forming the first plurality of conductive posts comprises electroplating.

6. The method of claim 1 wherein the first plurality of conductive posts are formed simultaneously on the first and second sides of the core structure.

7. The method of claim 1 wherein the first and second dielectric layers are deposited, simultaneously.

8. The method of claim 1 wherein the first plurality and the second plurality of conductive posts comprise copper.

9. The method of claim 1 wherein the core structure comprises a plated through hole.

10. The method of claim 9 wherein the plated through hole is filled with a dielectric material.

11. The method of claim 1
    wherein forming a first plurality of conductive posts comprises
       depositing first and second photoresist layers on the first and second sides of the core structure,
       forming a plurality of apertures in the first and second photoresist layers,
       forming the first plurality of conductive posts in the apertures in the first and second photoresist layers, and
    wherein the method further comprises
       removing the photoresist layers after forming the first plurality of conductive posts.

12. The method of claim 1 wherein the first and second dielectric layers comprise a polymeric material.

13. The method of claim 1 wherein depositing the first and second dielectric layers comprises laminating the first and second dielectric layers.

14. The method of claim 13 wherein laminating the first and second dielectric layers is performed simultaneously.

15. The method of claim 1 further comprising:
    partially curing the first and second dielectric layers;
    conditioning outer surfaces of the first and second dielectric layers;
    forming conductive patterns on the first and second dielectric layers; and
    fully curing the first and second dielectric layers.

16. The method of claim 1 wherein the second plurality of conductive posts are formed simultaneously.

17. The method of claim 1 further comprising, before forming a second plurality of conductive posts:
    forming first and second circuit patterns comprising a plurality of conductive pads on the first and second dielectric layers, wherein the conductive pads are disposed between the first plurality of conductive posts and the second plurality of conductive posts.

18. The method of claim 17 wherein the first and second circuit patterns are formed by electroplating.

19. The method of claim 1, wherein each of the second plurality of conductive posts includes an end proximate to the core structure and distal to the core structure, and wherein the method further comprises:
    curing the first and second dielectric layers after depositing the first and second dielectric layers;
    forming first and second conductive patterns comprising a plurality of conductive pads on the first and second dielectric layers after removing dielectric layer material from the distal ends of the first plurality of conductive posts and before forming a second plurality of conductive posts, wherein the conductive pads are disposed between the first plurality of conductive posts and the second plurality of conductive posts;
    depositing third and fourth dielectric layers on the first and second conductive patterns;
    removing dielectric layer material from the distal ends of the second plurality of conductive posts; and
    forming third and fourth circuit patterns on the third and fourth dielectric layers.

20. A method comprising:
    forming a first plurality of conductive posts on first and second sides of a circuitized core structure, each conductive post having an end proximate to the core structure and an end distal to the core structure;
    depositing a first dielectric layer on the first side of the core structure;
    depositing a second dielectric layer on the second side of the core structure;
    depositing first and second protective layers respectively on the first and second dielectric layers;
    removing dielectric layer material from the distal ends of the first plurality of conductive posts; and
    forming a second plurality of conductive posts on the distal ends of the first plurality of conductive posts.

21. The method of claim 20 wherein the dielectric layer material is removed through preformed apertures in the first and second protective layers.

22. A method comprising:
    forming a first plurality of conductive posts on a side of a circuitized core structure, each conductive post having an end proximate to the core structure and an end distal to the core structure;
    laminating a dielectric layer on the core structure;
    depositing a protective layer on the dielectric layer;
    removing dielectric layer material from the distal ends of the first plurality of conductive posts through the protective layer; and forming a second plurality of conductive posts on the distal ends of the first plurality of conductive posts.

23. The method of claim 22 further comprising, after removing dielectric layer material:
removing the protective layer.

24. The method of claim 22 wherein the protective layer comprises preformed apertures, and the dielectric layer material is removed through the preformed apertures.

25. The method of claim 22 wherein the deposited protective layer is continuous, and wherein removing dielectric layer material comprises laser ablating dielectric layer material from the distal ends of the first plurality of conductive posts.

26. The method of claim 22 further comprising:
forming a conductive pattern including conductive pads on the dielectric layer prior to forming the second plurality of conductive posts on the first plurality of conductive posts, wherein the conductive pads are disposed between the first and second plurality of conductive posts.

27. A method comprising:
forming a first plurality of conductive posts on first and second sides of a circuitized core structure, each conductive post having an end proximate to the core structure and an end distal to the core structure;
depositing a first dielectric layer on the first side of the core structure, said depositing including laminating a composite to the first side of the core structure, wherein the composite comprises a carrier layer and the first dielectric layer;
depositing a second dielectric layer on the second side of the core structure;
removing dielectric layer material from the distal ends of the first plurality of conductive posts;
forming a second plurality of conductive posts on the distal ends of the first plurality of conductive posts; and
removing the carrier layer.

28. The method of claim 27 further comprising:
curing the first dielectric layer.

29. The method of claim 27 further comprising:
laminating a release layer on the first dielectric layer; and
curing the first dielectric layer.

30. A method comprising:
forming a first plurality of conductive posts on first and second sides of a circuitized core structure, each conductive post having an end proximate to the core structure and an end distal to the core structure;
depositing a first dielectric layer on the first side of the core structure;
depositing a second dielectric layer on the second side of the core structure;
depositing a first and second protective layers respectively on the first and second dielectric layers, wherein the dielectric layer material on the distal ends of the first plurality of conductive posts is removed through first and second protective layers;
removing dielectric layer material from the distal ends of the first plurality of conductive posts; and
forming a second plurality of conductive posts on the distal ends of the first plurality of conductive posts.

31. The method of claim 30 wherein depositing a first dielectric layer on the first side of the core structure comprises:
laminating a composite to the first side of the core structure, wherein the composite comprises a carrier layer and the first dielectric layer.

32. The method of claim 31 further comprising:
removing the carrier layer.

33. The method of claim 32 further comprising:
curing the first dielectric layer.

34. The method of claim 30 wherein the core structure comprises a plated through hole.

35. The method of claim 34 wherein the plated through hole is filled with a dielectric material.

36. The method of claim 35 wherein said conductive posts are electrically coupled to a plate of the plated through hole.

37. The method of claim 26 additionally comprising forming, prior to forming the first plurality of conductive posts, a plurality of pads on said core structure.

38. The method of claim 37 wherein the end of each conductive post which is proximate to the core structure is supported by a pad.

39. The method of claim 34 wherein said conductive posts are offset from said plated through hole.

40. The method of claim 39 additionally comprising forming, prior to forming the first plurality of conductive posts, a plurality of pads on said core structure.

41. The method of claim 40 wherein the end of each conductive post which is proximate to the core structure is supported by a pad.

42. The method of claim 34 additionally comprising forming, prior to forming the first plurality of conductive posts, a plurality of pads on said core structure.

43. The method of claim 42 wherein the end of each conductive post which is proximate to the core structure is supported by a pad.

44. The method of claim 32 further comprising:
laminating a release layer on the first dielectric layer; and
curing the first dielectric layer.

45. The method of claim 30 wherein the dielectric layer material is removed through preformed apertures in the first and second protective layers.

46. The method of claim 45 wherein the core structure comprises a plated through hole.

47. The method of claim 46 wherein the plated through hole is filled with a dielectric material.

48. The method of claim 47 additionally comprising forming, prior to forming the first plurality of conductive posts, a plurality of pads on said core structure.

49. The method of claim 48 wherein the end of each conductive post which is proximate to the core structure is supported by a pad.

50. The method of claim 46 wherein said conductive posts are offset from said plated through hole.

51. The method of claim 50 wherein said conductive posts are electrically coupled to a plate of the plated through hole.

52. The method of claim 51 additionally comprising forming, prior to forming the first plurality of conductive posts, a plurality of pads on said core structure.

53. The method of claim 52 wherein the end of each conductive post which is proximate to the core structure is supported by a pad.

54. The method of claim 46 additionally comprising forming, prior to forming the first plurality of conductive posts, a plurality of pads on said core structure.

55. The method of claim 54 wherein the end of each conductive post which is proximate to the core structure is supported by a pad.

56. A method comprising:
forming a first plurality of conductive posts on first and second sides of a circuitized core structure comprising a plated through hole, each conductive post having an end proximate to the core structure and an end distal to the core structure;

depositing a first dielectric layer on the first side of the core structure;

depositing a second dielectric layer on the second side of the core structure;

removing dielectric layer material from the distal ends of the first plurality of conductive posts;

forming a second plurality of conductive posts on the distal ends of the first plurality of conductive posts; and said first and second plurality of conductive posts are offset from said plated through hole.

57. The method of claim 56 wherein said conductive posts are electrically coupled to a plate of the plated through hole.

58. The method of claim 57 additionally comprising forming, prior to forming the first plurality of conductive posts, a plurality of pads on said core structure.

59. The method of claim 58 wherein the end of each conductive post which is proximate to the core structure is supported by a pad.

60. The method of claim 56 additionally comprising forming, prior to forming the first plurality of conductive posts, a plurality of pads on said core structure.

61. The method of claim 60 wherein the end of each conductive post which is proximate to the core structure is supported by a pad.

62. A method comprising:

forming a plurality of pads on a circuitized core structure;

forming a first plurality of conductive posts on first and second sides of the circuitized core structure, each conductive post having an end proximate to the core structure and an end distal to the core structure;

depositing a first dielectric layer on the first side of the core structure;

depositing a second dielectric layer on the second side of the core structure;

removing dielectric layer material from the distal ends of the first plurality of conductive posts; and forming a second plurality of conductive posts on the distal ends of the first plurality of conductive posts.

63. The method of claim 62 wherein the end of each conductive post which is proximate to the core structure is supported by a pad.

* * * * *

UNITED STATES PATENT AND TRADEMARK OFFICE
CERTIFICATE OF CORRECTION

PATENT NO.    : 6,428,942 B1                                              Page 1 of 1
DATED         : August 6, 2002
INVENTOR(S)   : Hunt Hang Jiang et al.

It is certified that error appears in the above-identified patent and that said Letters Patent is hereby corrected as shown below:

<u>Column 14,</u>
Line 11, delete "26" and insert therefore -- 36 --.

Signed and Sealed this

Eighteenth Day of May, 2004

JON W. DUDAS
*Acting Director of the United States Patent and Trademark Office*